US006529967B1

(12) United States Patent
Robertson (10) Patent No.: US 6,529,967 B1
(45) Date of Patent: Mar. 4, 2003

(54) SYSTEM FOR MONITORING AND DETECTING DIFFERENCE VOLTAGE LEVELS OF I/O ADAPTER CARDS VIA A CONNECTOR (75) Inventor: Paul Gordon Robertson, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/392,836

(22) Filed: Sep. 9, 1999

(51) Int. Cl.7 .............................. G06F 13/00; G06F 3/00
(52) U.S. Cl. ............................ 710/16; 710/15; 710/62; 710/63; 710/102; 713/300; 439/55
(58) Field of Search ............................ 710/15, 16, 62, 710/63, 102; 439/55; 713/300

(56) References Cited

U.S. PATENT DOCUMENTS 5,568,610 A * 10/1996 Brown ........................ 714/48
5,734,919 A * 3/1998 Walsh et al. ................ 365/63
5,758,171 A * 5/1998 Ramamurthy et al. ...... 713/300
5,911,050 A * 6/1999 Egan et al. .................. 361/58
5,930,496 A * 7/1999 MacLaren et al. ........... 439/55
6,269,416 B1 * 7/2001 Meier et al. ................ 710/102

* cited by examiner

Primary Examiner—Jeffrey Gaffin
Assistant Examiner—Tammara Peyton
(74) Attorney, Agent, or Firm—Mark E. McBurney (57) ABSTRACT A system and method are provided for detecting when a valid configuration of I/O adapters is present in the system board of a computer. The present invention is a mechanism that allows the system user to determine the configuration of the I/O adapter cards to be used, independent of their voltage levels. More particularly, if the programmed voltage of the computer system power supply is compatible with the desired adapter card, the present invention will allow the card to be inserted and used. The present invention includes a connector that is physically capable of receiving any one of a variety of adapter cards, independent of the operating voltage level of the adapter cards. The present invention is a mechanism for detecting a valid mix of adapter cards inserted into connectors on the system board of a computer. When adapter cards having different voltage ratings are inserted into the slots, power on operations are not allowed preventing possible damage to the computer.

13 Claims, 5 Drawing Sheets

SYSTEM FOR MONITORING AND DETECTING DIFFERENCE VOLTAGE LEVELS OF I/O ADAPTER CARDS VIA A CONNECTOR

BACKGROUND OF THE INVENTION

1. Field of the Invention

The present invention relates to computer systems which include at least one adapter card that is inserted into a connector present on the system board of the computer. More particularly, the present invention allows adapter cards having different voltages to be physically inserted into the same standard connector on the system board wherein the voltage level is detected. When the detected voltage is consistent with the programmed power supply voltage level of the computer system, the computer is enabled to begin its power on procedure.

2. Description of Related Art

As computer technology continually advances the voltage levels used to operate various types of microelectronic devices, i.e. transistors, is typically becoming lower. That is, existing, older devices may have been designed and manufactured to operate at 5.0 volts, while more recently developed devices may operate at 3.3 volts, or the like. Also, technical reasons may exist for having some devices operate at 3.3 volts and others at 5.0 volts. Thus, there are devices, such as I/O adapter cards, on the market that operate at different voltages. Further, these devices are often needed for various computing applications and must be accommodated by the available computer systems.

One specific example where this problem arises is in the area of I/O adapters connected to a computer system through a secondary bus. One popular type of secondary bus is the Peripheral Component Interconnect (PCI) Bus. The specification for this bus anticipates a need for both 3.3 volt and 5.0 volt adapters to address the various types of computer configurations that may be developed.

Computer system designers are often faced with the question of whether or not to support, for example, 3.3 volt PCI local bus I/O adapters in their systems. Generally, when a designer chooses to support 3.3 volt PCI adapters on the bus, then 5.0 volt adapters are not supported. Therefore, the computer designers/manufacturers are in the position of deciding for the end user what types of I/O adapters can be used on the customer's system. More particularly, if a computer manufacturer, such as IBM, Dell, Compaq, or the like, determines that the PCI bus will be compatible with 3.3 volt devices, then specific 3.3 volt compatible connectors will be attached to the system board of the computer. These 3.3 volt connectors will only physically accept 3.3 volt I/O adapters, i.e. 5.0 volt adapters cannot be inserted into 3.3 volt connectors. Similarly, 5.0 volt connectors cannot physically accept 3.3 volt adapters. Therefore, it can be seen that the end user is limited to using only those types of adapters which are compatible with the connectors physically mounted on the system board of the computer system.

The PCI Local Bus Specification defines two different connector types, 5.0 volt and 3.3 volt, while three different adapter types are defined, 5.0 volt, 3.3 volt (5.0 volt intolerant) and Universal (5.0 volt tolerant). A 5.0 volt PCI adapter card can only be inserted into a 5.0 volt PCI connector. Similarly, a 3.3 volt PCI adapter card can only be inserted into a 3.3 volt PCI connector. However, the Universal adapter card can be inserted in either. These restrictions are enforced by adapter and connector keying which is defined by the PCI Local Bus Specification.

Of course, it is possible to design a system with redundant PCI buses to accommodate cards of different voltages, i.e. both 3.3 volt connectors and 5.0 volt connectors, however, this type of design is costly and inefficient. Further, universal adapter cards exist which can be inserted into either a 3.3 volt or 5.0 volt connector, but the user is still limited. That is, the function desired by the user may not be implemented in an I/O adapter card available in a universal format.

Therefore, in order to maintain flexibility of the system design, it would be desirable if the ultimate system's user could have the option of choosing whether to support 5.0 volt or 3.3 volt adapters, rather than being locked into one or the other. An example may be a system design which could be configured as a graphics workstation or as a low end server. The same computer system layout (e.g. processor, system bus, memory system, and the like), but different I/O adapters would be used to address the different applications. In this case, the graphics workstation may use 3.3 volt PCI adapter cards, while a low end server configuration could use 5.0 volt PCI adapter cards. In this case, it would be desirable to enable the system manufacturer to build one system, having a uniform type of connector which accepts both 3.3 and 5.0 volt cards, that would be capable of operating as either a graphics work station or a low end server.

Therefore, it can be seen that a need exists for a connector configuration that would accept either a 3.3 volt or 5.0 volt adapter card and determine whether the inserted adapters are compatible with one another and the programmed power supply voltage level of the computer system.

SUMMARY OF THE INVENTION

In contrast to the prior art, the present invention provides a connector capable of receiving differently configured I/O adapters. That is, by way of example, both a 3.3 volt adapter and 5.0 volt adapter can be inserted into a connector designed in accordance with the present invention.

Broadly, the present invention is a mechanism that allows the system user to determine the configuration of the I/O adapter cards to be used, independent of their voltage levels. More particularly, if the computer system power supply is programmed at a voltage level compatible with the desired adapter card, the present invention will allow the card to be inserted and used.

The present invention includes a connector that is physically capable of receiving any one of a variety of adapter cards, independent of the operating voltage level of the adapter cards. Further, the present invention comprehends a system design which will accept any PCI adapter type and then dynamically determine whether the configuration is valid, or not, prior to powering on the system. The present invention includes a customized PCI Local Bus connector type which will allow insertion of any PCI adapter type (e.g. 3.3 volt or 5.0 volt) and system logic capable of detecting the type of each installed PCI adapter and then allowing, or enabling the system to power on if the set of installed PCI adapters are compatible with each other and the programmed voltage level of the system power supply.

The present invention detects when a valid mix of adapter cards is inserted into the connectors on the system board of a computer. When adapter cards having different voltage ratings are inserted into the connector slots, power on operations are not allowed thereby preventing possible damage to the computer.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
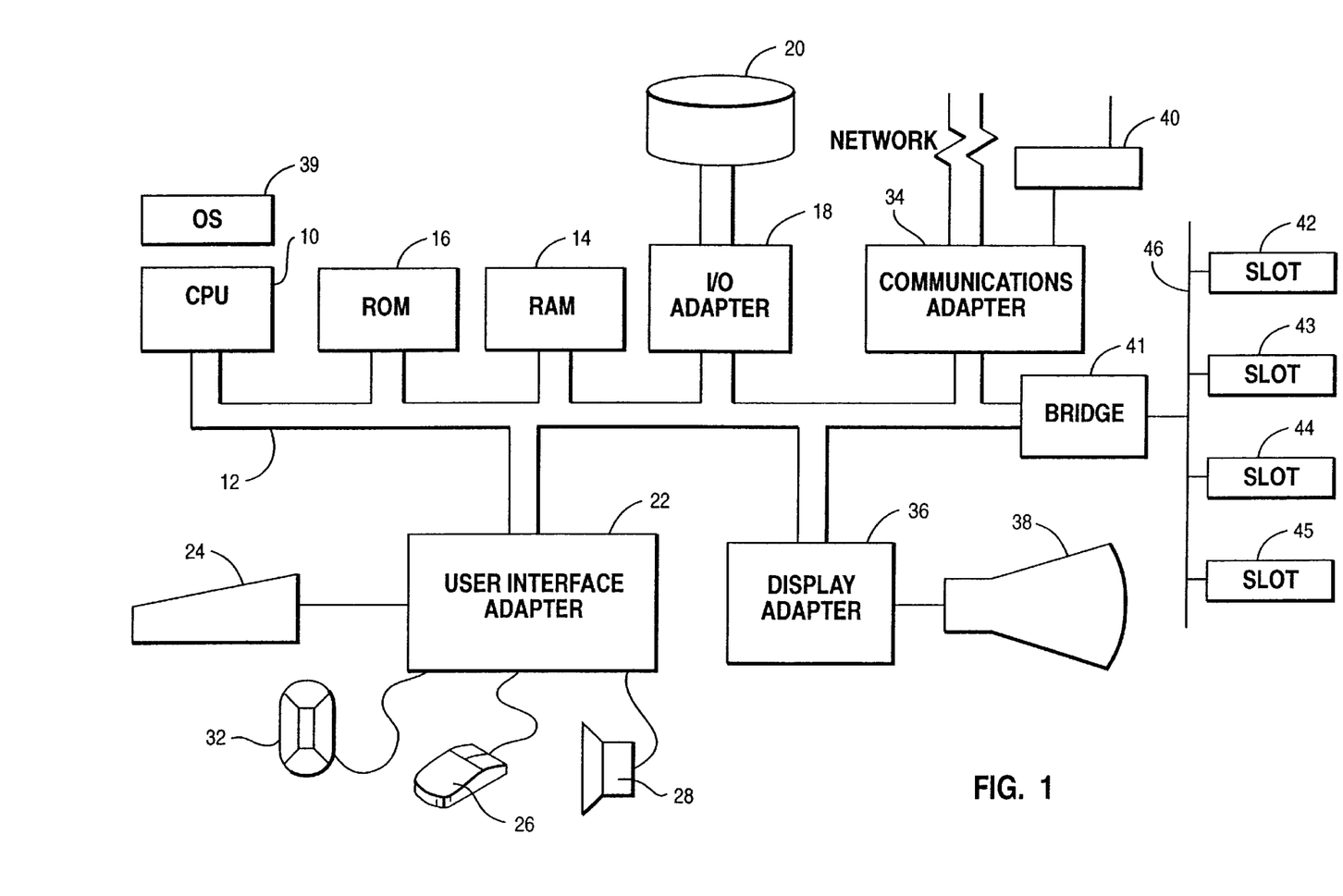
FIG. 1 is a block diagram of a computer system capable of implementing the connection mechanism of the present invention.

Referring to FIG. 1, a typical data processing system is shown which may be used in conjunction with the present invention. A central processing unit (CPU) 10, such as a PowerPC microprocessor, commercially available from the IBM Corporation or a Pentium microprocessor, available from Intel Corporation is provided and interconnected to the various other system components by a system bus 12. Read only memory (ROM) 16 is connected to CPU 10 via bus 12 and includes the basic input/output system (BIOS) that controls the basic computer functions. Random access memory (RAM) 14, I/O adapter 18 and communication adapter 34 are also connected to system bus 12. I/O adapter 18 may be a small computer system interface (SCSI) adapter that communicates with a disk storage device 20. Communications adapter 34 may be a network card that interconnects bus 12 with an outside network. Adapter 34 may also include an I/O port that allows a connection to be made, through a modem 40, or the like to enable the data processing system to communicate with other such systems via the Internet, or other communications network (LAN, WAN). User input/output devices are also connected to system bus 12 via user interface adapter 22 and display adapter 36. Keyboard 24, track ball 32, mouse 26 and speaker 28 are all interconnected to bus 12 via user interface adapter 22. Display monitor 38 is connected to system bus 12 by display adapter 36. In this manner, a user is capable of inputting to the system through keyboard 24, trackball 32 or mouse 26 and receiving output from the system via speaker 28 and display 38. Additionally, an operating system (OS) 39, such as DOS, OS/2, Windows 95, Windows 98, Windows NT, or the like is shown running on CPU 10 and used to coordinate the functions of the various components shown in FIG. 1.

In accordance with the present invention, a bridge device 41 is included in the system of FIG. 1. Bridge 41 may be a host bridge, PCI-PCI bridge chip or the like that coordinates communications between various buses, such as system bus 12 and I/O bus 46, e.g. a PCI bus. This functionality includes providing arbitration for access to the interconnected buses, as well as translating protocols, addresses and the like such that information can be transmitted from one bus to another (i.e. bus 12 to bus 46 and vice versa). Accordingly, I/O slots 42, 43, 44 and 45 are shown which accommodate I/O adapter cards that provide specific data processing functions, such as graphics enhancement, or the like. Slots 42, 43, 44 and 45 are connected to bus 46 which is in communication with system bus 12 via bridge 41.

It should be noted that by way of example and not limitation, a PCI bus will be used herein as an example of a preferred embodiment of the present invention. The Peripheral Component Interconnect (PCI) Local Bus Specification, rev 2.2, is hereby incorporated by reference. However, it should be noted that the scope of the present invention contemplates other internal and I/O buses that may address the same issues as those discussed herein.

Figure 2:
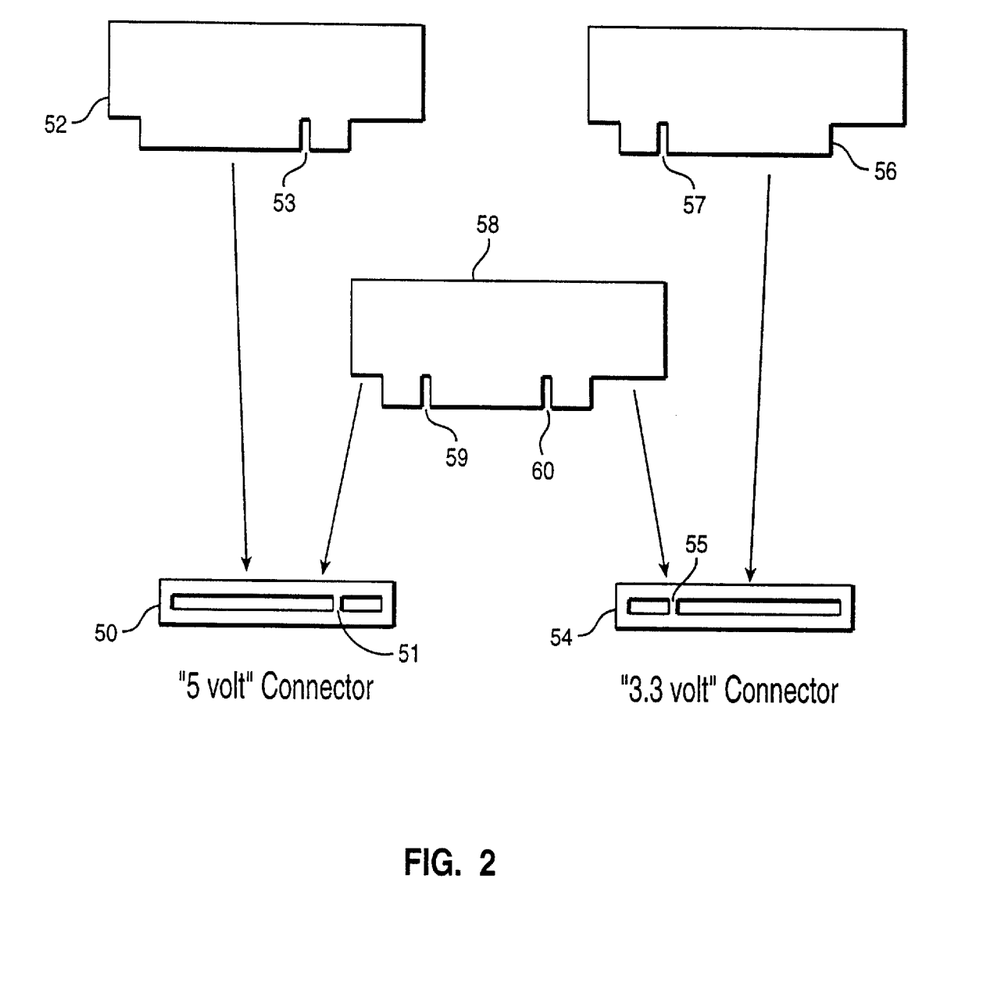
FIG. 2 is an exploded view of a 5.0 volt and 3.3 volt PCI adapter card and their corresponding connector.

Referring to FIG. 2, the standard implementation of PCI adapter cards having different voltages is shown and will now be described. As noted above, adapter cards of varying voltages are now available and may be desired for use in a given computer system. To accommodate this desire the current PCI bus specification provides for different connectors (slots) to be used for the corresponding adapter cards. The PCI Local Bus Specification defines two different connector types, 3.3 volt and 5.0 volt connectors, while three different adapter types are defined. The connectors are keyed to prevent a non-compatible adapter from being inserted thereto. This methodology requires that the computer system manufacturer know which types of adapter cards will be desired by the end user. For example, a computer manufacturer will need to know whether to install 3.3 volt connectors or 5.0 volt connectors, on the system board, at the time the system is built. It is not always possible to accurately predict how the system will be used (e.g. graphics workstation or low end server). In this manner a 5.0 volt adapter could not be used in a system manufactured with 3.3 volt connectors. Similarly, 3.3 volt adapters could not be used is a 5.0 volt system.

It can be seen from FIG. 2 that 5.0 volt connector 50 includes a key 51 that prevents a 3.3 volt card 56, but allows a 5.0 volt card 52 to be inserted therein. Key slot 53 allows card 52 to be inserted into connector 50 by accepting connector key 51. Similarly, 3.3 volt connector 54 includes key 55 that prevents 5.0 volt card 52, but allows 3.3 volt card 56 to be accepted therein by way of key slot 57. Universal cards 58 are available which can operate at both 3.3 and 5.0 volt levels and can be inserted into both the 3.3 volt and 5.0 volt connectors due to the dual key slots 59 and 60 that are present therein and correspond with keys 55 and 51 of connectors 54 and 50, respectively.

Those skilled in the art will understand that connectors 50 and 54 are wired into a system board (motherboard) wherein the wiring terminates at a contact, or pinout point on the connector. In accordance with the PCI specification (pps 143–145 of the PCI Local Bus Specification, a portion of which is included herein as Table 1), four pinouts (two on each side) are present where each key 51 and 55 are located. These four pinouts are connected to electrical ground. That is, pins A12, A13, B12 and B13 are all connected to ground for the 3.3 volt boards 56 and universal boards 58. Further pins A50, A51, B50, B51 are grounded for the 5.0 volt boards 52, as well as universal boards 58.

TABLE 1

PCI Pinout

| Pin(s) | 5.0 Volt System | | 3.3 Volt System | | Comments |
|---|---|---|---|---|---|
| | Side B | Side A | Side B | Side A | |
| 1–11 | | | | | |
| 12 | Gnd | Gnd | Gnd | Gnd | 3.3 volt key |
| 13 | Gnd | Gnd | Gnd | Gnd | 3.3 volt key |
| 14–49 | | | | | |
| 50 | Gnd | Gnd | Gnd | Gnd | 5.0 volt key |
| 51 | Gnd | Gnd | Gnd | Gnd | 5.0 volt key |
| 52–94 | | | | | |

Figure 3:
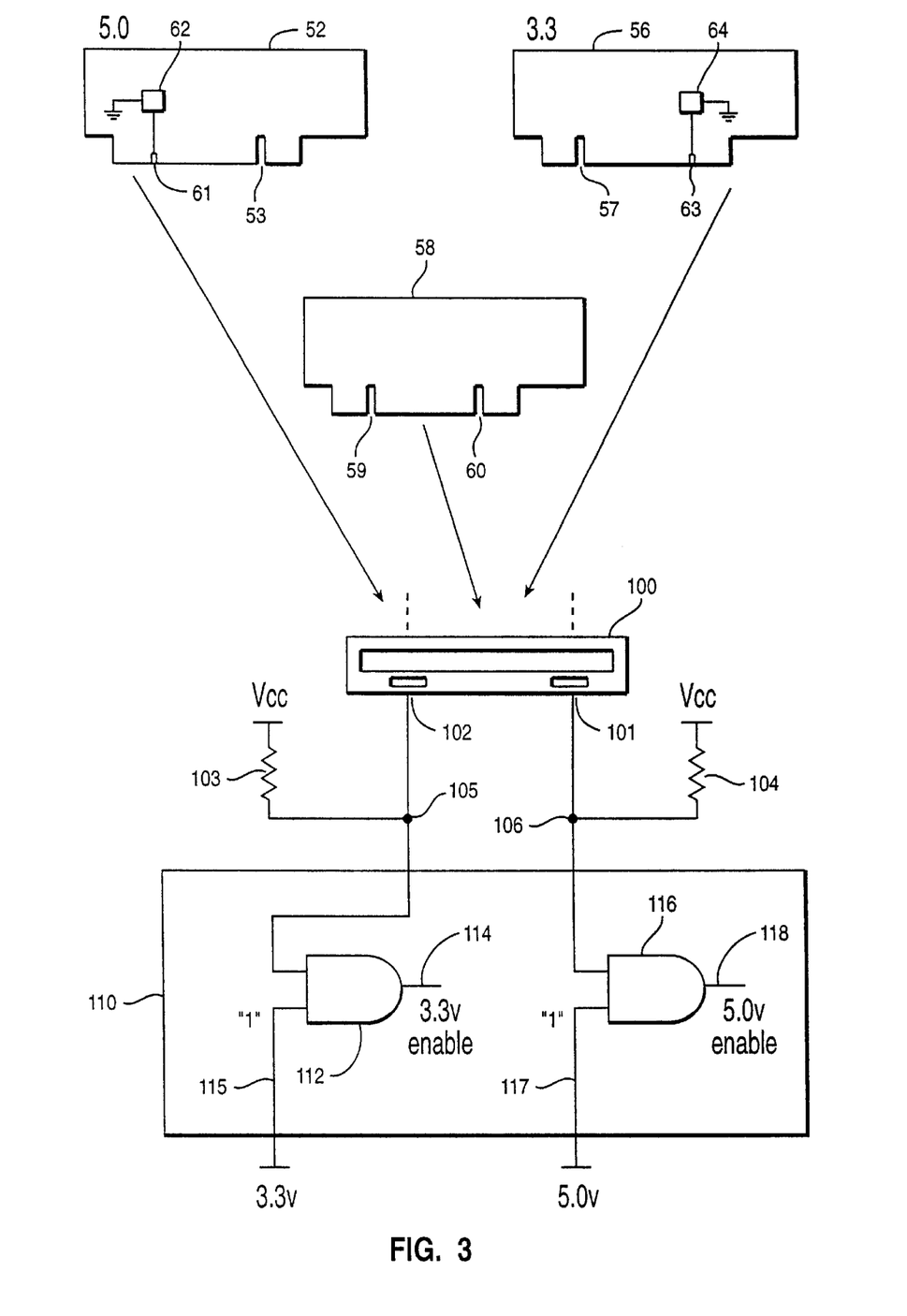
FIG. 3 is another exploded view of the connector mechanism of the present invention, as well as 3.3 and 5.0 volt adapter cards along with some representative detection logic used in accordance with a preferred embodiment of the present invention.

Referring to FIG. 3, 3.3 volt adapter card 56 is further shown as including a contact 63 that is connected to a reference voltage through electronic device 64, such as logic circuits, or the like. Similarly, 5.0 volt adapter card is shown having contact 61 that is electrically connected to ground through electronic device 62. As noted previously, both adapter cards 52 and 56 include key slots 53 and 57, respectively, for mating with the key in conventional PCI connectors 50 and 54 (FIG. 2).

Also shown in FIG. 3 is universal adapter 58 that includes key slots 56 and 60. In accordance with the present invention, a connector slot 100 is provided that does not include any keys to prevent any compatible adapter card from being inserted thereto. As noted previously each point where a key was placed on a conventional PCI connector included four grounded pins (see Table 1). The present invention utilizes one of these four pins at each key site and reconnects this pin to the power supply voltage (Vcc) to provide a detection point for determining whether an adapter card with an acceptable voltage level is inserted in the connector.

More particularly, as shown in FIG. 3, a pin, or contact point 102 corresponding to key slot 57 of 3.3 volt adapter card 56 and 5.0 volt adapter card 52 ground contact 61 is shown as being included in connector 100. Also, contact 101 is provided in connector 100 that corresponds with key slot 53 of 5.0 volt adapter card 52 and 3.3 volt adapter card 56 ground contact 63. Contact 102 is electrically connected to node 105 and a resistor 103, which is in turn connected to the system power supply voltage (Vcc). Similarly, contact 101 is connected to node 106, which is in electrical communication with a resistor 104. The system power supply voltage Vcc is then connected to the resistor 104, as shown. Resistors 103, 104 are provided such that when a ground potential is provided to contacts 102 (when a 5.0 volt card is inserted) and 101 (when a 3.3 volt card is inserted), the Vcc power supply rail will not be short circuited to ground.

Nodes 105, 106 are used to detect the presence of either a 3.3 volt adapter, 5.0 volt adapter or a universal adapter. By way of example and not limitation control logic 110 is shown that will enable a computer system to be powered on in accordance with the type of card inserted in connector 100. Control logic 110 may include AND gates 112, 116 having nodes 105, 106 input thereto, respectively. Output nodes 114 and 118 will send enable signals to the system CPU, a service processor, multi-voltage intelligent power supply, or the like, in order to cause the system to be powered on when the appropriate adapter card is inserted in connector 100.

The operation of the present invention will now be described in conjunction with FIG. 3. For example, when a 5.0 volt adapter 52 is inserted into connector 110, contact 102 is connected to ground potential through card contact 61 and device 62. Thus, ground potential is present at node 105 (logical zero). On the other hand, pin 101 is presented as an open connection since no electrical contact is made due to key slot 53. Thus, the system voltage Vcc (logical one) is present at node 106. For the case of a 5.0 volt adapter, logical (0, 1) is present at nodes 105 and 106, respectively. When a 3.3 volt adapter card is inserted in connector 100, pin 102 encounters an open circuit condition such that a voltage is now present at node 105 (logical one). Contact 101 will electrically contact I/O point 63 and be pulled to ground potential (logical zero) through device 64, or the like, on card 56. Thus, when a 3.3 volt card is inserted into connector 100, a logical (1, 0) is present on nodes 105, 106, respectively. For a universal card 58, both pins 101 and 102 will see an open circuit condition such that a voltage (Vcc) will be present at nodes 105 and 106 giving a logical (1, 1). It can be seen that for this implementation a logical (0, 0) is not possible, since it would require an adapter card that is grounded at two points corresponding to the key slot locations 56 and 60 in universal card 58. As noted above, the present invention is currently being described in conjunction with the PCI bus and adapter cards compatible therewith. Thus, for PCI cards, a (0, 0) will not be possible. However, other adapter card configurations are contemplated where different logical combinations can be used to detect the compatibility of such cards with the system power supply.

The following table summarizes the detection signals output at nodes 105, 106 based on the types of adapter cards inserted in connector 100 in accordance with a preferred embodiment of the present invention.

TABLE 2

| 5.0 v sense (node 105) | 3.3 v sense (node 106) | Description |
|---|---|---|
| 0 | 0 | impossible for PCI |
| 1 | 0 | 3.3 volt card |
| 0 | 1 | 5.0 volt card |
| 1 | 1 | Universal card |

Thus, if the impossible case of a (0, 0) is disregarded, it can be seen when contact 101 (also node 106) is a zero, the card is a 5.0 volt card. When contact 102 (node 105) is a zero, the adapter is a 3.3 volt card.

It should be noted that many different types of logic can then be used to decode this information and control the computer system to ensure that power on will occur only when cards of an appropriate voltage are used. For example, a simplistic example of control logic is shown in FIG. 3 by reference numeral 110 and will now be described. When a 5.0 volt card 52 is inserted into connector 100, a logical 0 (ground) is present at node 105 (contact 102) and a logical 1 (voltage) is present at node 106 (contact 101). Thus, a (0, 1) is present at nodes 105, 106, respectively. Node 105 is also an input to AND gate 112, with node 106 being an input to AND gate 116. Input 115 to AND gate 112 is connected to 3.3 volts (logical 1) and input 117 to AND gate 116 is connected to a 5.0 volt source (logical 1). It should be noted that 3.3 and 5.0 volts are used in conjunction with the description of the preferred embodiment of the present invention in a PCI bus environment, however, other voltages can be used and are contemplated by the scope of the present invention.

As noted above, when a 5.0 volt card 52 is inserted into connector 100, a logical 0 will be input to AND gate 112 and a logical "1" will be input to AND gate 116. When the logical 0 at gate 112 is ANDed with the logical 1 (voltage)

from input 115, then a logical 0 (low) is output on node 114 and the 3.3 volt operation is not enabled. However, when the logical 1 of node 106 is ANDed with the logical 1 of input 117 by AND gate 116, the 5.0 volt enable signal output from node 118 is a logical 1 (high) such that 5.0 volt operations are allowed to proceed and the computer system then powers on at 5.0 volts. Those skilled in the art will understand how a CPU, service processor, intelligent power supply, control logic or the like can be implemented to interpret the high signal from AND gate 116 to cause the system to power on, while disregarding the low signal from AND gate 112.

On the other hand, when a 3.3 volt card 56 is inserted into connector 100, a logical 1 will be input to AND gate 112, from node 105, and a logical 0 will be input to AND gate 116 from node 106. When the logical 1 at gate 112 is ANDed with the logical 1 (voltage) from input 115, then a logical 1 (high) is output on node 114 and 3.3 volt operation is enabled such that the computer system then powers on at 3.3 volts. But, when the logical 0 of node 106 is ANDed with the logical 1 of input 117 by AND gate 116, the 5.0 volt enable signal output from node 118 is a logical 0 (low) such that 5.0 volt operations are disabled and the computer system is prevented from powering on at 5.0 volts.

For the case of a universal card 58, both of nodes 105, 106 will be at a logical 1, thereby causing the output of both AND gates 112, 116 to be high and the computer system is enabled to operate at either a 3.3 volt or 5.0 volt level (depending on the programmed voltage level of the power supply).

It should be noted that many other configurations of control logic are contemplated by the present invention. For example, an intelligent power supply may be provided that can receive signal(s) and determine appropriate voltage levels to be used. That is, nodes 105, 106 could be directly connected to the power supply and internal logic can determine that: (0, 1) corresponds to a 5.0 volt card; (1, 0) corresponds to a 3.3 volt card; and (1, 1) corresponds to a universal card. An intelligent power supply would then cause a voltage level to be output that is compatible with the received input signals. Further, input from nodes 105, 106 could be provided to a service processor that is responsible for the internal processes implemented by the computer system, e.g. system boot. Similarly, an embedded controller (microcontroller) could also be provided that interprets the signals from nodes 105, 106 and controls the power supply voltage accordingly.

Figure 4:
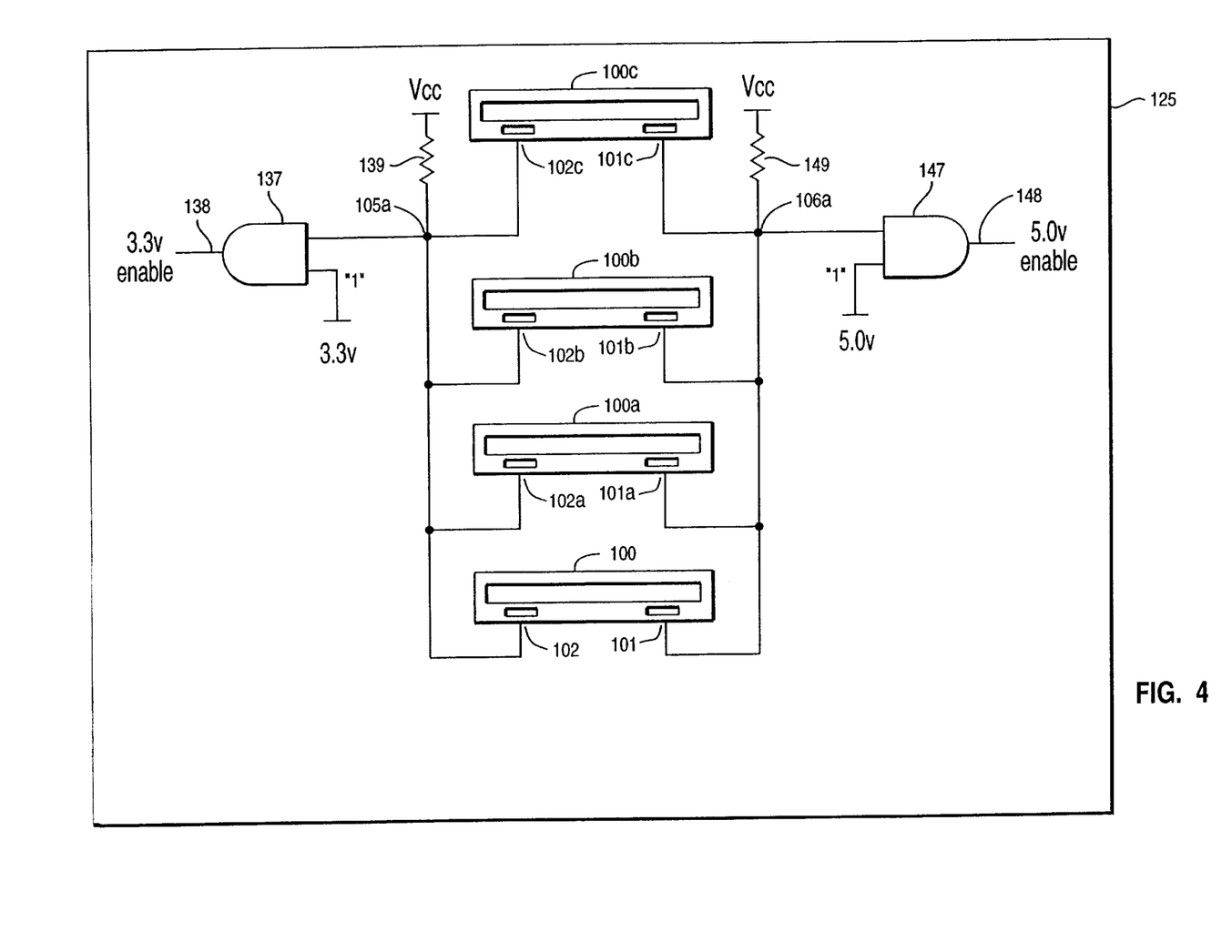
FIG. 4 is block diagram of another preferred embodiment of the invention wherein a system board in a computer system including multiple connectors can detect a valid adapter configuration.

In accordance with FIG. 4, multiple connectors 100, 100*a*, 100*b*, 100*c* are shown mounted to a system board 125 (motherboard) in the computer system. Each connector includes pins 102, 101; 102*a*, 101*a*; 102*b*, 101*b*; 102*c*, 101*c*, respectively. Pins 102, 102*a*, 102*b*, 102*c* are all connected to a node 105*a* and input to an AND gate 137, which also includes a 3.3 volt power supply input (logical 1). Pins 101, 101*a*, 101*b*, 101*c* are connected together at a node 106*a*, which is then input to another AND gate 147 along with a 5.0 volt power supply input (logical 1). It can be seen that the embodiment of FIG. 4 has pins 102, 102*a*, 102*b*, 102*c* connected to Vcc through a resistor 139. Additionally, pins 101, 101*a*, 101*b*, 101*c* are all connected to Vcc through a resistor 149. In this manner the present invention can monitor each of the plural connectors 100, 100*a*, 100*b*, 100*c* on motherboard 125 to ensure that adapter cards having appropriate voltages, consistent with the programmed power supply voltages, are being used.

The operation of the embodiment of FIG. 4 will now be described. As noted above, when a 3.3 volt card is inserted into any of connectors 100, 100*a*, 100*b*, 100*c*, key slot 57 will cause a voltage to be present at node 105a and a logical 1 input to AND gate 137. When ANDed with the 3.3 volt input (logical 1), the 3.3 volt system enable signal output on signal line 138 is driven high. At the same time, for 3.3 volt cards, contact 63 will cause node 106*a* to be pulled to ground and a zero is input to AND gate 147. A logical zero (low) is then provided on 5.0 volt enable signal line 148 and 5.0 volt operation is not permitted.

Similarly, when a 5.0 volt card is inserted into any of connectors 100, 100*a*, 100*b*, 100*c*, key slot 53 will cause a voltage to be present at node 106*a* and a logical 1 input to AND gate 147. When ANDed with the 5.0 volt input, the 5.0 volt system enable signal output on signal line 148 is driven high and power on occurs at 5.0 volts. At the same time, for 5.0 volt adapter cards, contact 61 will cause node 105*a* to be pulled to ground and a zero is input to AND gate 137. A logical zero (low) is then provided on 3.3 volt enable signal line 138 and 3.3 volt operation is not permitted. For universal cards, a voltage (logical 1) will be present at both nodes 105*a* and 106*a* such that either 3.3 volt or 5.0 volt operations are allowed.

By connecting contacts 102, 102*a*, 102*b*, 102*c* to node 105*a* and contacts 101, 101*a*, 101*b*, 101*c* to node 106*a*, respectively, the present invention can determine when a valid mix of adapter cards is present in slots 100, 100*a*, 100*b* and 100*c*. For example, when slots 100, 100*a* and 100*c* contain 3.3 volt cards and connector 100*b* includes a universal card, then a voltage will be present at node 105*a* and 3.3 volt operations are enabled. The universal card in slot 100*b* will present an open circuit condition that would normally cause a voltage also to be present at node 106*a*. However, the presence of 3.3 volt cards in slots 100, 100*a* and 100*c* will cause node 106*a* to be pulled to ground such that 5.0 volt operations will not be enabled. As another example, assume the 3.3 volt cards 56 are inserted into slots 100, 100*a*, with a universal card 58 inserted in slot 100*b* and a 5.5 volt card 52 in slot 100*c*. In this case the ground contact 61 of card 52 in slot 100*c* will pull node 105*a* to zero and a logical zero (low) is output by AND gate 137. Furthermore, ground contact 64 of the 3.3 volt cards 56 will pull node 106*a* to ground (logical zero) such that the output of AND gate 147 is low. Thus, neither the 3.3 volt enable signal 138 nor the 5.0 volt enable signal 148 will be high. In this case, the present invention indicates that an invalid mix of adapter cards (adapter cards having different operating voltages) is present in connectors 100, 100*a*, 100*b*, 100*c* and system power on is prohibited.

It can be seen that many other combinations of adapter cards having different voltages can be detected by a system such as the present invention. Accordingly, all of these other combinations and implementations are contemplated by the scope of the present invention.

Figure 5:
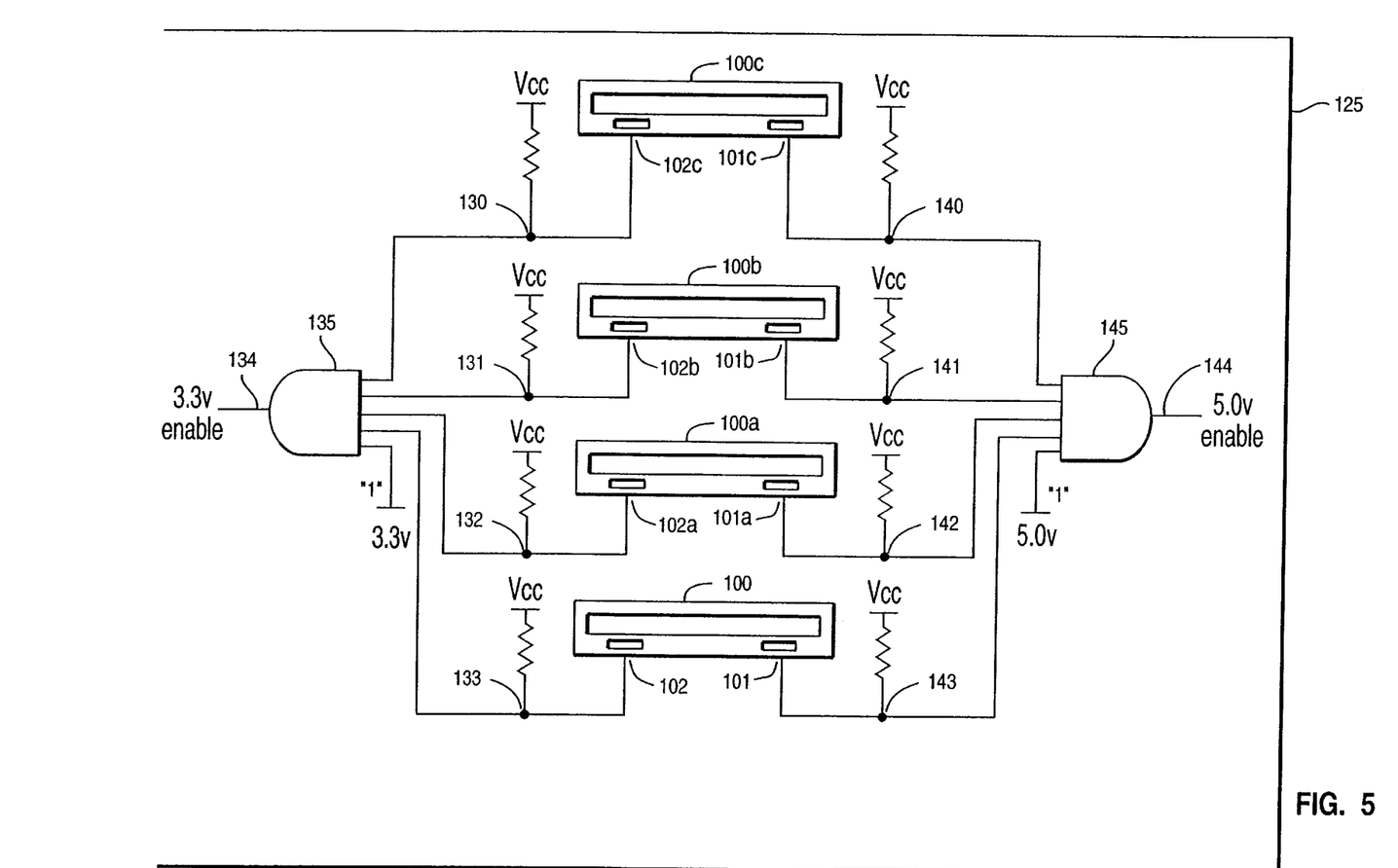
FIG. 5 shows another preferred embodiment where the present invention monitors the mix of adapter cards inserted into plural connectors present on the motherboard of a computer system.

Referring to FIG. 5 another embodiment of the present invention is shown and will now be described. Connectors 100, 100*a*, 100*b* and 100*c* are present on motherboard 125, as previously described in conjunction with FIG. 4. However, each of the contacts 102, 102*a*, 102*b*, 102*c* and 101, 101*a*, 101*b*, 101*c* are connected to Vcc through a resistor. As can be seen, contacts 102, 102*a*, 102*b*, 102*c* are respectively connected to nodes 133, 132, 131, 130, while contacts 101, 101*a*, 101*b*, 101*c* are connected to nodes 143, 142, 141, 140, respectively. These nodes are connected as inputs to AND gates 135 and 145.

As an example, when either universal cards 58 or 3.3 volt cards 56 are inserted into connectors 100, 100*a*, 100*b* and 100c, then a voltage is present on nodes 133, 132, 131, 130 such that all logical ones are present as inputs to AND gate 135 and 3.3 volt operation is enabled. However, if a 5.0 volt card is inserted into one of the slots, e.g. 100b, then the corresponding node 131 will be pulled to ground and a logical zero will be input to AND gate 135 and 3.3 volt enable signal 134 will be low, preventing 3.3 volt operations due to an invalid adapter mix.

Similarly, when either universal cards 58 or 5.0 volt cards 58 are inserted into connectors 100, 100a, 100b and 100c, then a voltage is present on nodes 143, 142, 141, 140 such that all logical ones are present as inputs to AND gate 145 and 5.0 volt operation is enabled. However, if a 3.3 volt card is inserted into one of the slots, e.g. 100b, then the corresponding node 141 will be pulled to ground and a logical zero will be input to AND gate 145 and the 5.0 volt enable signal 144 will be low, preventing 5.0 volt operations due to an invalid adapter mix.

Those skilled in the art will readily comprehend that the present invention is a mechanism for detecting a valid mix of adapter cards inserted into connectors on the system board of a computer. When adapter cards having different voltage ratings are inserted into the slots, power on operations are not allowed preventing possible damage to the computer. While the present invention has been described relative to a secondary I/O bus (PCI) and corresponding I/O adapter cards, it should be understood that many different types of connectors and criteria (in addition to voltage levels) are contemplated by the scope of the present invention.

Although certain preferred embodiments have been shown and described, it should be understood that many changes and modifications may be made therein without departing from the scope of the appended claims.

What is claimed is:

1. A data processing system that performs operations at a plurality of operating voltages, comprising:
   a central processing unit;
   a plurality of connectors coupled to said central processing unit for receiving at least one of a first adapter card operating at a specific first voltage and including a reference contact for providing a first reference voltage to a means for detecting, within said connectors, when said first adapter card is inserted in said connector and a voltage contact for providing said first operating voltage when said first adapter card is inserted in said connector, a second adapter operating at a specific second voltage, different from said specific first voltage, and including a reference contact for providing a second reference voltage when said second adapter card is inserted in said connector and a voltage contact for providing said second operating voltage when said second adapter card is inserted in said connector, and a third adapter card for operating at either said first or second operating voltage;
   means, within said connectors, for detecting the operating voltage of one of said first, second, or third adapter cards inserted in said connector; and
   means for enabling said operations performed by said data processing system when said operating voltage is compatible with one of the first or second operating voltages
   wherein said data processing system is enabled when said connectors include at least one said first adapter card, at least one said second adapter card, at least one said third adapter card, in combination with at least one of either said first adapter card or said second adapter card.

2. A data processing system according to claim 1 wherein said means for detecting comprises means for receiving said first reference voltage and said first operating voltage when said first adapter card is inserted in said connector and for receiving said second reference voltage and said second operating voltage when said second adapter card is inserted in said connector.

3. A data processing system according to claim 2 wherein said means for detecting further comprises means for comparing said first operating voltage and said second operating voltage with said plurality of operating voltages.

4. A data processing system according to claim 3 wherein said means for enabling comprises means for transmitting a first control signal to enable said data processing system at a first one of said plurality of operating voltages that matches said first operating voltage.

5. A data processing system according to claim 4 wherein said means for enabling comprises means for transmitting a second control signal to enable said data processing system at a second one of said plurality of operating voltages that matches said second operating voltage.

6. A data processing system according to claim 5 wherein said first control signal and said second control signal are received by said central processing unit.

7. A data processing system according to claim 6 wherein said first control signal and said second control signal are received by a power supply capable of regulating said operating voltage used by said data processing system.

8. A method of processing data in a system that operates at a plurality of operating voltages, said method comprising the steps of:
   providing a central processing unit;
   coupling, to said central processing unit, a plurality of connectors for receiving at least one of a first adapter card operating at a specific first voltage and including a reference contact for providing a first reference voltage to a means for detecting, within said connectors, when said first adapter card is inserted in said connector and a voltage contact for providing said first operating voltage when said first adapter card is inserted in said connector, a second adapter operating at a specific second voltage, different from said specific first voltage, and including a reference contact for providing a second reference voltage when said second adapter card is inserted in said connector and a voltage contact for providing said second operating voltage when said second adapter card is inserted in said connector, and a third adapter card for operating at either said first or second operating voltage;
   detecting, by said connectors, the operating voltage of one of said first, second, or third adapter cards inserted in said connector; and
   enabling operation of said data processing system when said operating voltage is compatible with one of said plurality of operating voltages;
   wherein said data processing system is enabled when said connectors include at least one said first adapter card, at least one said second adapter card, at least one said third adapter card, or at least one said third adapter card in combination with at least one of either said first adapter card or said second adapter card.

9. A method according to claim 8 wherein said step of detecting comprises the steps of:
   receiving said first reference voltage and said first operating voltage when said first adapter card is inserted in said connector; and
   receiving said second reference voltage and said second operating voltage when said second adapter card is inserted in said connector.

10. A method according to claim 9 wherein said step of detecting further comprises the step of comparing said first operating voltage and said second operating voltage with said operating voltages.

11. A method according to claim 10 wherein said step of enabling comprises the step of transmitting a first control signal to enable said first card when said first operating voltage matches one of said operating voltages.

12. A method according to claim 11 wherein said step of enabling comprises the step of transmitting a second control signal to enable said second card when said second operating voltage matches of one said operating voltages.

13. A method according to claim 12 further comprising the step of receiving said first control signal and said second control signal by said central processing unit.

* * * * *